(12) United States Patent
Duan

(10) Patent No.: US 9,887,665 B2
(45) Date of Patent: Feb. 6, 2018

(54) JUNCTION BOX FOR SOLAR CELL

(71) Applicant: Zhejiang Renhe Photovoltaic Technology Co., Ltd., Cixi, Zhejiang Province (CN)

(72) Inventor: Lijun Duan, Cixi (CN)

(73) Assignee: ZHEJIANG RENHE PHOTOVOLTAIC TECHNOLOGY CO., LTD., Cixi (CN)

( * ) Notice: Subject to any disclaimer, the term of this patent is extended or adjusted under 35 U.S.C. 154(b) by 0 days.

(21) Appl. No.: 15/350,900

(22) Filed: Nov. 14, 2016

(65) Prior Publication Data
US 2017/0353151 A1   Dec. 7, 2017

(30) Foreign Application Priority Data
Jun. 3, 2016   (CN) .......................... 2016 1 0385651

(51) Int. Cl.
| H01L 31/05 | (2014.01) |
| H02S 40/34 | (2014.01) |
| H02G 3/08 | (2006.01) |
| H01L 31/054 | (2014.01) |
| H01L 31/02 | (2006.01) |
| H01L 31/052 | (2014.01) |

(52) U.S. Cl.
CPC ...... *H02S 40/345* (2014.12); *H01L 31/02021* (2013.01); *H01L 31/052* (2013.01); *H01L 31/0504* (2013.01); *H01L 31/054* (2014.12); *H02G 3/081* (2013.01)

(58) Field of Classification Search
CPC ............. H01L 31/02021; H01L 31/044; H01L 31/052; H01L 31/0504; H01L 31/054
See application file for complete search history.

(56) References Cited

U.S. PATENT DOCUMENTS

| 7,723,608 | B2* | 5/2010 | Higashikozono .... | H01R 9/2425 |
| | | | | 136/244 |
| 7,723,609 | B2* | 5/2010 | Yoshikawa ............. | H02S 40/34 |
| | | | | 136/244 |
| 7,920,385 | B2* | 4/2011 | Yoshikawa ............. | H02G 3/16 |
| | | | | 136/244 |
| 2005/0224110 | A1* | 10/2005 | Yoshikawa ....... | H01L 31/02008 |
| | | | | 136/251 |
| 2005/0236031 | A1* | 10/2005 | Higashikozono ....... | H02S 40/34 |
| | | | | 136/251 |
| 2007/0221919 | A1* | 9/2007 | Sato ...................... | H01L 27/142 |
| | | | | 257/44 |
| 2013/0206203 | A1* | 8/2013 | Lommasson ....... | H01L 31/0504 |
| | | | | 136/244 |

* cited by examiner

*Primary Examiner* — Golam Mowla
(74) *Attorney, Agent, or Firm* — Jiwen Chen

(57) ABSTRACT

The invention discloses a junction box for a solar cell. The junction box includes a box body, wherein the box body is provided with a plurality of conducting pieces for connecting solar cell pieces; two adjacent conducting pieces are connected by a diode; the conducting pieces at both ends are connected to the outside via a guide line respectively; and the chip area of the diode in the middle is bigger than that of the diodes at both sides. According to the invention, the diode with bigger chip area is employed in parts where the temperature rise is easily produced to reduce the temperature rise; while the diode with smaller chip area is employed in parts where the temperature rise is not easily produced to control cost.

5 Claims, 5 Drawing Sheets

JUNCTION BOX FOR SOLAR CELL

This application claims the priority benefit of Chinese Application No. 201610385651.6, filed Jun. 3, 2016, which is hereby incorporated by reference.

TECHNICAL FIELD

The present invention belongs to the field of solar power generation technology, and more particular, to a junction box for a solar cell.

BACKGROUND ART

In the field of solar power generation, a junction box is a vital accessory. Electric current produced by solar cell pieces needs to be gathered via the junction box to be output. In the prior art, the junction box structure includes a box body, the box body is provided with a plurality of conducting pieces for connecting the solar cell pieces; a plurality of diodes are connected among various conducting pieces and connected with component cell pieces for bypass; and the conducting pieces at both ends are connected to the outside via a guide line, respectively.

In the prior art, the main problem faces by the junction box is heating. The conducting pieces and diodes will heat up when the current passes through. If the temperature is too high, the normal use of those parts will be affected. In order to solve these problems, two solutions are generally adopted. One solution is to enlarge the surface areas of the diodes so that the flux is increased and heating is reduced. The other solution is to enlarge the surface areas of the conducting pieces so that the heat dissipation surface is increased to accelerate the heat dissipation. However, both of the methods will increase the cost of the junction box.

The Japanese Patent No. JP4699060 discloses a solar cell junction box, wherein different heat dissipation areas are designed according to the temperature rise degrees of the different conducting pieces so as to make the best use of all heat dissipation areas, thus preferably balancing the heat dissipation effect and the manufacturing cost.

SUMMARY OF THE INVENTION

An object of the present invention is to provide a junction box for a solar cell, which can economically and reasonably reduce the heating.

Therefore, the technical scheme employed in the present invention is as follows: a junction box for a solar cell comprising a box body, wherein the box body is provided with a plurality of conducting pieces for connecting with the solar cell pieces; two adjacent conducting pieces are connected by a diode; the conducting pieces at both ends are connected to the outside via a guide line respectively; characterized in that the chip area of the diode in the middle is bigger than that of the diodes at both sides.

As a further technical scheme, the box body is provided with N+1 conducting pieces connected by N diodes, and the chip area of each diode satisfies the following conditions:
when N is an even number, both formula I and II are satisfied;
when N is an odd number, both formula III and IV are satisfied;

$$S_{\frac{N}{2}} \geq S_{\frac{N}{2}-1} \geq \ldots > S_1 \quad \text{Formula I}$$

$$S_{\frac{N}{2}+1} \geq S_{\frac{N}{2}+2} \geq \ldots > S_N \quad \text{Formula II}$$

$$S_{\frac{N+1}{2}} \geq S_{\frac{N+1}{2}-1} \geq \ldots > S_1 \quad \text{Formula III}$$

$$S_{\frac{N+1}{2}} \geq S_{\frac{N+1}{2}+1} \geq \ldots > S_N \quad \text{Formula IV}$$

wherein: S is the chip area and the subscript represents the sequence of the diodes.

As the most common technical scheme, the box body is provided with 4 conducting pieces connected by 3 diodes, wherein the chip area of the diode in the middle is bigger than that of the diodes at both ends.

The difference of the chip surfaces of the diode can be realized either by employing different models of diodes, or by setting different numbers of diodes to connect in parallel, or setting grooves on the surface of the chips.

After the diode is connected, the temperature of the junction box rises, and the heating source is mainly from the diodes, specially related to its passing rate. Therefore, heating can be reduced by the increase of the chip area of the diode so as to further reduce the temperature rise. But it does not seem desirable to the blindly increase in the chip area of the diode. Through great research efforts by applicant, it was discovered that the temperature rise of the diodes in different places is different. As a whole, the temperature rise of the diode in the middle is greater than that of the diodes at both sides. Therefore, the applicant designs the technical scheme that the diode with bigger chip area is employed in parts where the temperature rise is easily produced to reduce the temperature rise; while the diode with smaller chip area is employed in parts where the temperature rise is uneasily produced to control cost.

Recently, there's a new way to produce diodes named "Trench", it can make shallow trench isolation areas on the chip surface, therefore in the same chip shape, the diode can get a bigger chip area and higher passing rate.

BRIEF DESCRIPTION OF THE DRAWINGS

The present invention is further described in details hereinafter by reference to the drawings and the exemplary embodiments of the present invention.

Figure 1:
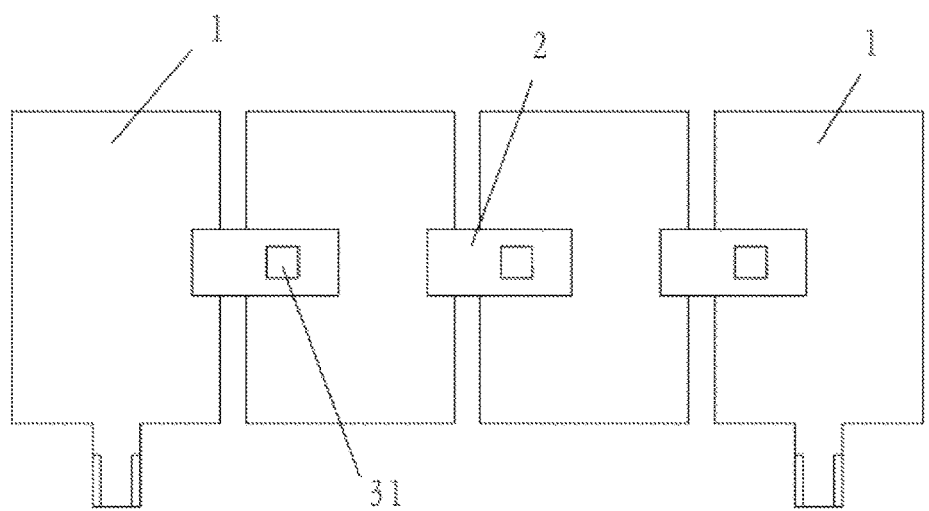
FIG. 1 is a structural schematic diagram of a junction box in the prior art.

Reference numerals in figures: conducting piece 1, diode 2, middle diode 21, two-end diode 22, first chip 31, second chip 32, third chip 33, trench/groove 34.

DETAILED DESCRIPTION OF THE PREFERRED EMBODIMENTS

Referring to the drawings, the junction box described in the embodiment comprises a box body, wherein the box body is provided with a plurality of conducting pieces 1 for connecting solar cell pieces; two adjacent conducting pieces 1 are connected by a diode 2; the conducting pieces 1 at both ends are connected to the outside via a busbar respectively; as illustrated in FIG. 1, in the prior art, the box body is provided with four conducting pieces 1 connected by three diodes 2, and the chip areas of a first chip 31 on all the diodes 2 are the same. It does not seem desirable as the cost is increased greatly once the chip area of the diode is increased.

As the temperature rise of the diode in the middle is greater than that of the diodes at both sides, the method employed in the embodiment is that the chip area of the diode in the middle is increased so that it is bigger than that of the chip of the diodes at both sides.

First Embodiment

Figure 2:
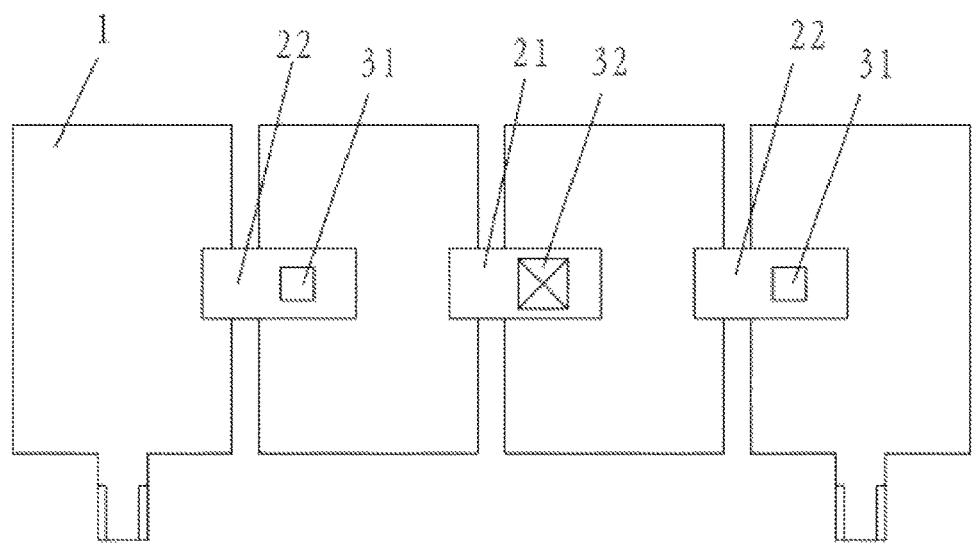
FIG. 2 is a structural schematic diagram of the first embodiment of the present invention.

As illustrated in FIG. 2, the box body of the embodiment is provided with four conducting pieces 1 for connecting solar cell pieces; two adjacent conducting pieces 1 are connected by a diode, three diodes in total are connected; the conducting pieces 1 at both ends are connected to the outside via a busbar respectively; wherein the model of a second chip 32 of the middle diode 21 is different from that of the first chip 31 of two-end diodes 22. The area of first chip 31 is: S1=length*width=130 mil*130 mil, S3=length*width=130 mil*130 mil; the area of second chip 32 used in the middle diode 21 is: S2=length*width=150 mil*150 mil, (1000 mil=1 inch, mil is the common size unit of diodes). The area of the second chip 32 on the middle diode 21 is bigger than that of the first chip 31 on the two-end diode 22. Thus, the cost increase is controlled due to the decrease in heating.

Second Embodiment

Figure 3:
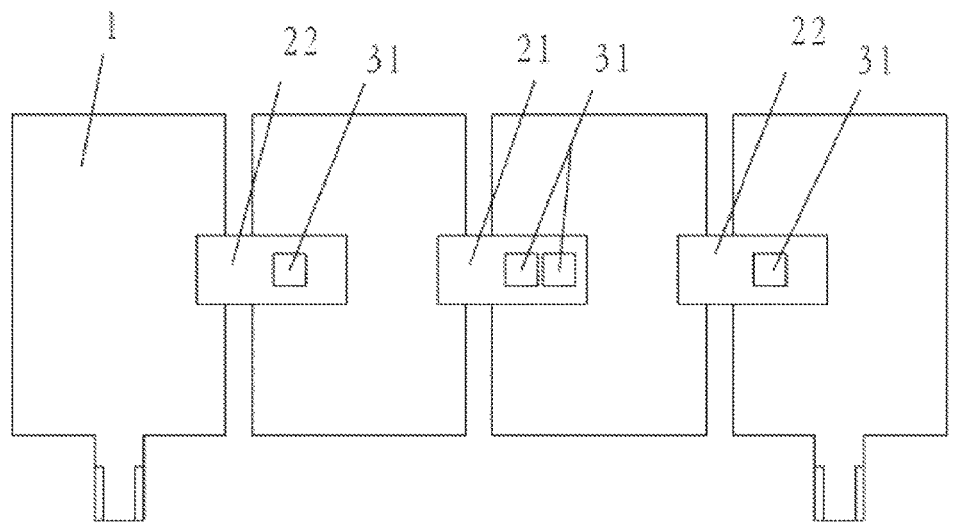
FIG. 3 is a structural schematic diagram of the second embodiment of the present invention.

As illustrated in FIG. 3, the box body of the embodiment is provided with four conducting pieces 1 for connecting solar cell pieces; two adjacent conducting pieces 1 are connected by a total of three diodes; the conducting pieces 1 at both ends are connected to the outside parts via a busbar respectively; wherein the middle diode 21 is parallelly connected with two first chips 31 respectively, so the chip area of the first chip 31 of the two-end diode 22 is: S1=length*width=130 mil*130 mil, S3=length*width=130 mil*130 mil, the chip area of the second chip 32 used on the middle diode 21 is: S2=2*S1=2*length*width=2*130 mil*130 mil, (1000 mil=1 inch, mil is the common size unit of diodes). The total heat disseminating area of the two first chips 31 on the middle diode 21 is bigger than the chip area of the two-end diode 22. Thus, the cost increase is controlled due to the decrease in heating.

Third Embodiment

Figure 4:
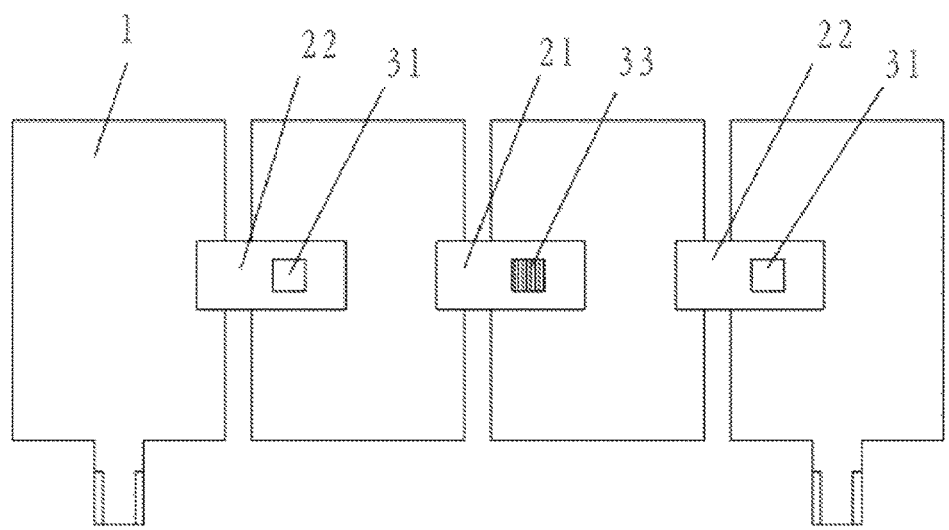
FIG. 4 is a structural schematic diagram of the third embodiment of the present invention.
Figure 5:
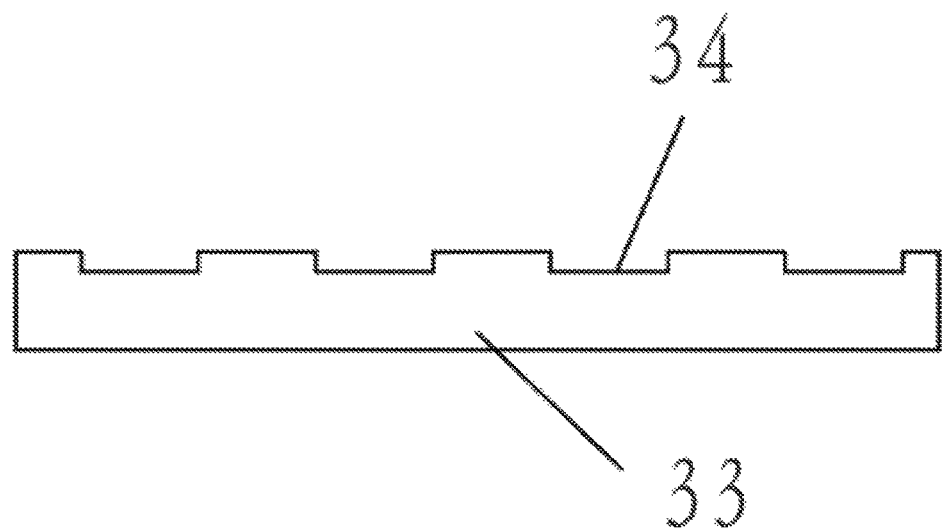
FIG. 5 is a side view of a middle diode chip of the third embodiment of the present invention.

As illustrated in FIG. 4, the box body of the embodiment is provided with four conducting pieces 1 for connecting solar cell pieces; two adjacent conducting pieces 1 are connected by a total of three diodes; the conducting pieces 1 at both ends are connected to the outside parts via a busbar respectively; wherein the surface of a third chip 33 on the middle diode 21 is provided with a trench or groove 34, the chip area of the third chip 33 is increased by the trench or groove 34 so as to be bigger than that of the first chip 31 on the two-end diode 22. Thus, the cost increase is controlled due to the decrease in heating.

The invention claimed is:

1. A junction box for a solar cell, comprising a box body, wherein the box body is provided with a plurality of conducting pieces for connecting solar cell pieces; two adjacent conducting pieces are connected by a diode; the conducting pieces at both ends are connected to outside parts via a guide line respectively; characterized in that chip area of a diode in the middle is bigger than that of diodes at both sides, wherein the box body is provided with N+1 conducting pieces connected by N diodes and the Chip area of each diode satisfies the following conditions: when N is an even number, both formulas I and II are satisfied; When N is an odd number, both formulas III and IV are satisfied;

$$S_{\frac{N}{2}} \geq S_{\frac{N}{2}-1} \geq \ldots > S_1 \qquad \text{Formula I}$$

$$S_{\frac{N}{2}+1} \geq S_{\frac{N}{2}+2} \geq \ldots > S_N \qquad \text{Formula II}$$

$$S_{\frac{N+1}{2}} \geq S_{\frac{N+1}{2}-1} \geq \ldots > S_1 \qquad \text{Formula III}$$

$$S_{\frac{N+1}{2}} \geq S_{\frac{N+1}{2}+1} \geq \ldots > S_N \qquad \text{Formula II}$$

wherein S is the chip area and subscript represents the sequence of the diodes.

2. The junction box for the solar cell according to claim 1, wherein the box body is provided with four conducting pieces connected by three diodes, wherein the chip area of the diode in the middle is bigger than that of the diodes at both ends.

3. The junction box for the solar cell according to claim 1, wherein the difference of the chip area of the diodes is realized by employing different models of diodes.

4. The junction box for the solar cell according to claim 1, wherein the difference of the chip area of the diodes is realized by using different number of diodes.

5. The junction box for the solar cell according to claim 1, wherein the difference of the chip area of the diodes is realized by providing grooves on the surface of chip.

* * * * *